(12) United States Patent
Tsuchiya et al.

(10) Patent No.: US 10,344,185 B2
(45) Date of Patent: Jul. 9, 2019

(54) COMPOSITION FOR POLISHING SILICON WAFERS

(71) Applicant: FUJIMI INCORPORATED, Kiyosu-shi, Aichi (JP)

(72) Inventors: Kohsuke Tsuchiya, Aichi (JP); Hisanori Tansho, Aichi (JP); Yusuke Suga, Aichi (JP)

(73) Assignee: Fujimi Incorporated, Kiyosu-shi (JP)

( * ) Notice: Subject to any disclaimer, the term of this patent is extended or adjusted under 35 U.S.C. 154(b) by 0 days.

(21) Appl. No.: 15/309,281

(22) PCT Filed: Jun. 17, 2015

(86) PCT No.: PCT/JP2015/003021
§ 371 (c)(1),
(2) Date: Nov. 7, 2016

(87) PCT Pub. No.: WO2015/198561
PCT Pub. Date: Dec. 30, 2015

(65) Prior Publication Data
US 2017/0081554 A1    Mar. 23, 2017

(30) Foreign Application Priority Data
Jun. 24, 2014 (JP) .................... 2014-129497

(51) Int. Cl.
| | |
|---|---|
| H01L 21/306 | (2006.01) |
| C09G 1/02 | (2006.01) |
| B24B 37/00 | (2012.01) |
| C09K 3/14 | (2006.01) |
| B24B 37/24 | (2012.01) |
| H01L 21/02 | (2006.01) |
| B24B 37/04 | (2012.01) |

(52) U.S. Cl.
CPC .............. *C09G 1/02* (2013.01); *B24B 37/00* (2013.01); *B24B 37/044* (2013.01); *B24B 37/24* (2013.01); *C09K 3/14* (2013.01); *H01L 21/02021* (2013.01); *H01L 21/02024* (2013.01); *H01L 21/02052* (2013.01); *H01L 21/30625* (2013.01)

(58) Field of Classification Search
CPC ....... B24B 37/00; B24B 37/24; B24B 37/044; C09G 1/02; C09K 3/14; H01L 21/02024; H01L 21/304; H01L 21/30625; H01L 21/02021; H01L 21/02052
USPC .... 252/79.1, 79.2, 79.3, 79.4; 438/690, 691, 438/692, 693
See application file for complete search history.

(56) References Cited

U.S. PATENT DOCUMENTS

| | | | |
|---|---|---|---|
| 9,566,685 B2 | 2/2017 | Tsuchiya et al. | |
| 2007/0175104 A1 | 8/2007 | Nishiyama et al. | |
| 2009/0047786 A1* | 2/2009 | Fukasawa | C09G 1/02 438/693 |
| 2009/0093118 A1 | 4/2009 | Uotani et al. | |
| 2009/0270566 A1* | 10/2009 | Thorman | C08F 10/06 526/64 |
| 2009/0289217 A1* | 11/2009 | Sato | C09G 1/02 252/79.4 |
| 2010/0221918 A1 | 9/2010 | Takemura et al. | |
| 2011/0028073 A1* | 2/2011 | Fukasawa | C09G 1/02 451/41 |
| 2012/0108064 A1* | 5/2012 | Suzuki | B24B 37/044 438/689 |
| 2014/0302752 A1 | 10/2014 | Tsuchiya et al. | |
| 2015/0166838 A1 | 6/2015 | Tsuchiya et al. | |
| 2015/0210891 A1 | 7/2015 | Tsuchiya et al. | |
| 2015/0210892 A1 | 7/2015 | Tsuchiya et al. | |
| 2015/0376464 A1 | 12/2015 | Tsuchiya et al. | |
| 2016/0001416 A1 | 1/2016 | Tsuchiya et al. | |
| 2016/0215189 A1 | 7/2016 | Tsuchiya et al. | |

FOREIGN PATENT DOCUMENTS

| | | |
|---|---|---|
| DE | 11 2013 004 295 T5 | 5/2015 |
| EP | 1 870 928 A1 | 12/2007 |
| EP | 2 075 824 A1 | 7/2009 |
| EP | 2 957 613 A1 | 12/2015 |
| EP | 2 960 314 A1 | 12/2015 |
| EP | 3 053 977 A1 | 8/2016 |
| JP | 4772156 B | 9/2011 |
| JP | 2014-041978 A | 3/2014 |
| WO | WO-2007/055278 A1 | 5/2007 |
| WO | WO-2013/061771 A1 | 5/2013 |
| WO | WO 2013/108770 A1 | 7/2013 |
| WO | WO-2014/034425 A1 | 3/2014 |
| WO | WO 2014/126051 A1 | 8/2014 |

OTHER PUBLICATIONS

Notification of Reasons for Refusal received in corresponding application No. 2014-129497 dated Oct. 1, 2015 with its machine translation.

(Continued)

*Primary Examiner* — Lan Vinh
(74) *Attorney, Agent, or Firm* — Foley & Lardner LLP

(57) ABSTRACT

Provided is a composition for polishing silicon wafers, having an excellent effect of reducing haze and having low agglomerating property. A composition for polishing silicon wafers provided here includes: an amido group-containing polymer A; and an organic compound B not containing an amido group. The amido group-containing polymer A has, on a main chain, a building block S derived from a monomer represented by General Formula (1). Molecular weight $M_A$ of the amido group-containing polymer A and molecular weight $M_B$ of the organic compound B have a relation satisfying $200 \leq M_B < M_A$.

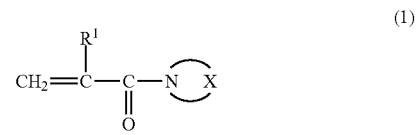

(1)

10 Claims, No Drawings

(56) References Cited

OTHER PUBLICATIONS

Decision of Refusal received in corresponding application No. 2014-129497 dated Feb. 4, 2016 with its machine translation.
Report of Reconsideration by Examiner before Appeal received in corresponding application No. 2014-129497 dated Jun. 23, 2016 with its machine translation.

* cited by examiner

COMPOSITION FOR POLISHING SILICON WAFERS

TECHNICAL FIELD

The present invention relates to a polishing composition used for polishing silicon wafers.

BACKGROUND ART

The surface of silicon wafers used as components in semiconductor products is commonly subjected to a lapping step (rough polishing step) and a polishing step (precision polishing step) to give a high-quality mirror surface. The polishing step typically includes a preliminary polishing step and a final polishing step. As the polishing method in the polishing step, chemical mechanical polishing using a polishing liquid containing a water-soluble polymer is known. By the method, adsorption and desorption of the water-soluble polymer to and from abrasives or silicon wafers contribute to a reduction in defects and haze of a polished surface. As a technical document on the composition for polishing silicon wafers, PTL 1 is exemplified. PTL 2 is a technical document on an abrasive used for polishing silicon dioxide.

CITATION LIST

PTL 1: JP 4772156 B
PTL 2: WO 2007/055278

SUMMARY OF INVENTION

Technical Problem

In recent years, semiconductor substrates such as silicon wafers and other substrates have been required to have higher-quality surfaces. Accordingly, there is a demand for a polishing composition capable of yielding substrate surfaces with lower haze. From the viewpoint of the handleability, there is another demand for improvement in the filterability of a polishing composition. To this end, it is important to provide a polishing composition with the generation of agglomerates suppressed.

The present invention therefore has an object to provide a silicon wafer polishing composition having excellent performances to reduce the haze of the surface of an object to be polished and having suppressed property of agglomeration (the property of particles contained in a polishing composition that agglomerate in the polishing composition).

Solution to Problem

According to the description, a composition for polishing silicon wafers used in the presence of abrasives is provided. This composition for polishing silicon wafers includes: a silicon-wafer polishing removal accelerator, an amido group-containing polymer A, an organic compound B not containing an amido group, and water. The amido group-containing polymer A has, on a main chain, a building block S derived from a monomer represented by General Formula (1).

[Chemical Formula 1]

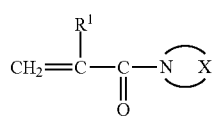

(1)

In General Formula (1), $R^1$ is a hydrogen atom; an alkyl group, an alkenyl group, an alkynyl group, an aralkyl group, an alkoxy group, an alkoxyalkyl group, or an alkylol group having the number of carbon atoms of 1 to 6; an acetyl group; a phenyl group; a benzyl group; a chloro group; a difluoromethyl group; a trifluoromethyl group; or a cyano group. X is $(CH_2)_n$, where n is an integer of 4 to 6, $(CH_2)_2O(CH_2)_2$ or $(CH_2)_2S(CH_2)_2$. The amido group-containing polymer A has molecular weight $M_A$ and the organic compound B has molecular weight $M_B$, and the molecular weight $M_A$ and the molecular weight $M_B$ have a relation satisfying $200 \leq M_B < M_A$. Such a polishing composition can achieve both of the performances of reducing haze and of reducing agglomeration property at a higher level.

In a preferred embodiment of the polishing composition disclosed here, a ratio $(M_A/M_B)$ of the molecular weight $M_A$ of the amido group-containing polymer A to the molecular weight $M_B$ of the organic compound B may be more than 5. Such an embodiment can achieve both of the performances of reducing haze and reducing agglomeration property at a higher level.

In a preferred embodiment of the polishing composition disclosed here, the molecular weight $M_B$ of the organic compound B may be less than $1 \times 10^4$. A polishing composition containing an organic compound B having such molecular weight $M_B$ and the amido group-containing polymer A in combination can exert the effect of reducing haze more favorably.

In a preferred embodiment of the polishing composition disclosed here, the molecular weight $M_A$ of the amido group-containing polymer A may be less than $50 \times 10^4$. A polishing composition containing an amido group-containing polymer A having such molecular weight $M_A$ and the organic compound B in combination can achieve both of the performances of reducing haze and reducing agglomeration property at a higher level.

In a preferred embodiment of the polishing composition disclosed here, in General Formula (1), $R^1$ may be a hydrogen atom or a methyl group. A polishing composition containing an amido group-containing polymer A having such a structure can achieve excellent performances of reducing haze and reducing agglomeration property.

In a preferred embodiment of the polishing composition disclosed here, in General Formula (1), X may be $(CH_2)_2O(CH_2)_2$. A polishing composition containing an amido group-containing polymer A having such a structure can achieve excellent performances of reducing haze and reducing agglomeration property.

In a preferred embodiment of the polishing composition disclosed here, the abrasives may include silica particles. In the polishing using silica particles as the abrasives, the haze reducing effect by the amido group-containing polymer A in combination with the organic compound B can be favorably exerted. Such an embodiment can reduce the agglomerating property of the polishing composition as well.

DESCRIPTION OF EMBODIMENTS

A preferable embodiment of the present invention will now be described. Matters not specifically mentioned in the description but required for carrying out the present invention can be understood as matters of design variation of a person skilled in the art based on related art in the field. The present invention can be carried out on the basis of the contents disclosed in the description and common general knowledge in the field.

<Amido Group-Containing Polymer A>

A polishing composition disclosed here contains an amido group-containing polymer A having, on the main chain, a building block S derived from a monomer s represented by General Formula (1).

General Formula (1):

[Chemical Formula 2]

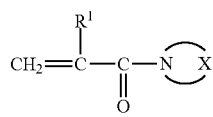

(1)

In General Formula (1), $R^1$ is a hydrogen atom; an alkyl group, an alkenyl group, an alkynyl group, an aralkyl group, an alkoxy group, an alkoxyalkyl group, or an alkylol group having the number of carbon atoms of 1 to 6; an acetyl group; a phenyl group; a benzyl group; a chloro group; a difluoromethyl group; a trifluoromethyl group; or a cyano group. Of them, a hydrogen atom, an alkyl group having the number of carbon atoms of 1 to 6, and a phenyl group are preferred, a hydrogen atom and an alkyl group having the number of carbon atoms of 1 or 2 are more preferred, and a hydrogen atom is specifically preferred. X may be $(CH_2)_n$. Here n is an integer of 4 to 6. X may be $(CH_2)_2O(CH_2)_2$ or $(CH_2)_2S(CH_2)_2$. Of them, X is $(CH_2)_2O(CH_2)_2$ preferably.

The monomer s disclosed here is exemplified by acryloylpiperidine, acryloylmorpholine, acryloylthiomorpholine, and acryloylpyrrolidine. The above-mentioned monomers s can be used singly or in combination of two or more of them.

The amido group-containing polymer A is preferably nonionic. In other words, a polymer substantially containing no anionic building block or no cationic building block is preferred. Here, the substantially containing no anionic building block or no cationic building block means that the molar proportion of such a building block is less than 3% (for example, less than 1%, preferably less than 0.5%). By using the polishing composition containing the nonionic amido group-containing polymer, the effect of reducing defects and haze is favorably exerted. Although the reason is not necessarily revealed, it can be supposed that the nonionic amido group-containing polymer A appropriately adsorbs to abrasives and silicon wafers at the time of polishing and thus contributes to a reduction of haze. It can also be supposed that the appropriate adsorption suitably prevents abrasives and polishing waste in a cleaning step from remaining and contributes to a reduction of defects.

The amido group-containing polymer A may have molecular weight ($M_A$) that is larger than molecular weight ($M_B$) of an organic compound B described later. For example, the molecular weight of the amido group-containing polymer A is typically less than $100\times10^4$, preferably less than $80\times10^4$, more preferably less than $50\times10^4$, and even more preferably less than $45\times10^4$ from the viewpoint of reducing the property of agglomeration and of improving the filterability, for example. In a preferred embodiment, the molecular weight of the amido group-containing polymer A may be less than $40\times10^4$, and may be $35\times10^4$ or less, for example. The molecular weight of the amido group-containing polymer A is typically $5\times10^3$ or more, and is preferably $1\times10^4$ or more and more preferably $5\times10^4$ or more from the viewpoint of reducing haze, for example. From the viewpoint of improving the polishing rate, in a preferred embodiment, the molecular weight of the amido group-containing polymer A may be $10\times10^4$ or more, and may be $15\times10^4$ or more for example. As the molecular weight of amido group-containing polymers A, the weight average molecular weight (Mw) determined by gel permeation chromatography (GPC) (aqueous system, in terms of polyethyleneglycol) can be used.

The relation between the weight average molecular weight Mw and the number average molecular weight Mn of the amido group-containing polymer A is not limited to particular values. For example, a polymer having a molecular weight distribution (Mw/Mn) of 5.0 or less is preferably used from the viewpoint of reducing agglomeration property, for example. The Mw/Mn of the amido group-containing polymer A is preferably 4.0 or less, more preferably 3.5 or less, and even more preferably 3.0 or less (for example, 2.5 or less) from the viewpoint of performance stability of the polishing composition, for example. In principle, the Mw/Mn is 1.0 or more. Commonly, an amido group-containing polymer A having an Mw/Mn of 1.05 or more is preferably used from the viewpoint of easy availability of raw materials and synthetic easiness.

The amido group-containing polymer A disclosed here is preferably composed of substantially only the building block S. In other words, in the amido group-containing polymer A, the proportion of the mole number of the building block S relative to the mole number of all building blocks contained in the molecular structure of the polymer (molar proportion) is preferably 97% by mole or more (for example, 99% by mole or more, typically 99.5 to 100% by mole). Preferred examples of such a polymer include homopolymers containing a single type of the monomer s disclosed here and copolymers containing two or more types of the monomer s.

The amido group-containing polymer A disclosed here may be a copolymer containing a building block derived from one or more types of a monomer t that is copolymerizable with the monomer s (hereinafter also called "building block T") to such an extent as not to greatly impair effects of the invention. The building block T is defined as a different building block from the building block S. In the amido group-containing polymer A, the proportion (molar proportion) of the building block T can be less than 50% by mole (for example, less than 30% by mole, typically less than 10% by mole).

The "% by mole" is a molar proportion calculated where a single building block derived from a single monomer (including the monomer s and the monomer t) is regarded as one molecule. Hence, the proportions of the building blocks S and T can correspond to the molar proportions of the monomer s and the monomer t, respectively, in all the monomer components used for polymerization.

<Organic Compound B>

A polishing composition disclosed here contains an organic compound B not containing an amido group, in addition to the amido group-containing polymer A as stated above. Preferably such an organic compound B typically has molecular weight ($M_B$) of 200 or more. An organic compound having the number of carbon atoms of 5 or more (preferably 6 or more, and more preferably 10 or more) is preferably used for this. Any organic compound B satisfying such a condition can be used, which is not limited especially. Examples of such an organic compound B include surfactant and water-soluble polymer not containing an amido group.

As the surfactant not containing an amido group, an anionic surfactant or a nonionic surfactant can be preferably adopted. From the viewpoint of low foaming properties and easy adjustment of pH, a nonionic surfactant is preferred.

Examples of nonionic surfactants include oxyalkylene polymers such as polyethylene glycol, polypropylene glycol, and polytetramethylene glycol; polyoxyalkylene adducts such as polyoxyethylene alkyl ethers, polyoxyethylene alkyl phenyl ethers, polyoxyethylene alkylamines, polyoxyethylene fatty acid esters, polyoxyethylene glyceryl ether fatty acid esters, and polyoxyethylene sorbitan fatty acid esters; and copolymers (diblock copolymers, triblock copolymers, random copolymers, alternating copolymers) of a plurality types of oxyalkylenes.

Specific examples of the nonionic surfactant include block copolymers of ethylene oxide (EO) and propylene oxide (PO) (diblock copolymers, polyethylene oxide (PEO)-polypropylene oxide (PPO)-PEO-type triblock copolymers, PPO-PEO-PPO-type triblock copolymers, for example), random copolymers of EO and PO, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene 2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octylphenyl ether, polyoxyethylene nonylphenyl ether, polyoxyethylene dodecyl phenyl ether, polyoxyethylene styrenated phenyl ether, polyoxyethylene laurylamine, polyoxyethylene stearylamine, polyoxyethylene oleylamine, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitol tetraoleate, polyoxyethylene castor oil, and polyoxyethylene hydrogenated castor oil. As preferred surfactants of them, block copolymers of EO and PO (especially, PEO-PPO-PEO-type triblock copolymers), random copolymers of EO and PO, and polyoxyethylene alkyl ethers (for example, polyoxyethylene decyl ether) are exemplified.

The water-soluble polymer not containing an amido group (hereinafter also called "optional polymer") may be a polymer having, in the molecule, at least one functional group selected from cationic groups, anionic groups, and nonionic groups. For example, the optional polymer can be a polymer having, in the molecule, a hydroxy group, a carboxyl group, an acyloxy group, a sulfo group, a quaternary ammoniums structure, a heterocyclic structure, a vinyl structure, a polyoxyalkylene structure, or the like. A nonionic polymer is preferably adopted as the optional polymer from the viewpoint of reducing agglomeration property or improving cleanability, for example.

Preferred examples of the optional polymer in the polishing composition disclosed here include polymers containing an oxyalkylene unit, polymers containing a nitrogen atom, and vinyl alcohol polymers.

Examples of the polymer containing an oxyalkylene unit include PEO, block copolymers of EO and PO, and random copolymers of EO and PO. The block copolymer of EO and PO can be diblock copolymers and triblock copolymers containing a PEO block and a PPO block, for example. Examples of the triblock copolymer include PEO-PPO-PEO-type triblock copolymers and PPO-PEO-PPO-type triblock copolymers. Commonly, a PEO-PPO-PEO-type triblock copolymer is preferred.

In block copolymers or random copolymers of EO and PO, the molar proportion of EO and PO (EO/PO) constituting the copolymer is preferably more than 1, more preferably 2 or more, and even more preferably 3 or more (for example, 5 or more) from the viewpoint of solubility in water and cleanability, for example.

As the polymer containing a nitrogen atom, either a polymer containing a nitrogen atom on the main chain or a polymer having a nitrogen atom on a side chain functional group (pendant group) can be used. Examples of the polymer containing a nitrogen atom on the main chain include homopolymers and copolymers of an N-acyl alkyleneimine type monomer. Specific examples of the N-acyl alkyleneimine type monomer include N-acetylethyleneimine and N-propionylethyleneimine. Examples of the polymer having a nitrogen atom on a pendant group include polymers containing an N-vinyl type monomer unit. For example, homopolymers and copolymers of N-vinylpyrrolidone can be adopted.

The vinyl alcohol polymer is typically a polymer containing a vinyl alcohol unit as a main repeating unit (PVA). In the polymer, the proportion of the mole number of a vinyl alcohol unit relative to the mole number of all repeating units is commonly 50% or more, preferably 65% or more, more preferably 70% or more, and, for example, 75% or more. Substantially all the repeating units may be composed of a vinyl alcohol unit. "Substantially" refers to that 95% or more of all repeating units are vinyl alcohol units. In PVA, the types of repeating units other than the vinyl alcohol unit is not limited to particular types, and can be one or more units selected from a vinyl acetate unit, a vinyl propionate unit, and a vinyl hexanoate unit, for example.

Other examples of the optional polymer that can be contained in the polishing composition disclosed here include cellulose derivatives such as hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose, and carboxymethyl cellulose and pullulan.

In the polishing composition disclosed here, the molecular weight $M_A$ of the amido group-containing polymer A and the molecular weight $M_B$ of the organic compound B have the relation satisfying $200 \leq M_B < M_A$. Such a relation of the molecular weight $M_B$ of the organic compound B being less than the molecular weight $M_A$ of the amido group-containing polymer A leads to both of the performances of reducing haze and of reducing agglomeration property at a higher level. Reducing agglomeration property in the polishing composition is preferable because the filterability of the polishing composition can be improved. Although the reason for obtaining the property of reducing haze is not necessarily revealed, it can be supposed that the organic compound B having low molecular weight adsorbs to a silicon wafer densely so as to fill the gaps of the amido group-containing polymer A having high molecular weight at the time of polishing and thus contributes to a reduction of haze.

From the viewpoint of reducing haze and reducing agglomeration property, for example, the ratio $(M_A/M_B)$ of the molecular weight $M_A$ of the amido group-containing polymer A to the molecular weight $M_B$ of the organic compound B is approximately $(M_A/M_B) \geq 1.5$, preferably $(M_A/M_B) \geq 2$, and more preferably $(M_A/M_B) > 5$. In a preferred embodiment, the ratio may be $(M_A/M_B) \geq 7$, or may be $(M_A/M_B) \geq 10$, for example. When the organic compound B is surfactant, the $(M_A/M_B)$ may be $(M_A/M_B) \geq 30$, $(M_A/M_B) \geq 300$ or $(M_A/M_B) \geq 500$. The upper limit of $(M_A/M_B)$ is not limited especially, and $(M_A/M_B) \leq 5000$ is preferable from the viewpoint of the performances of reducing haze, for example, and $(M_A/M_B) \leq 1000$ is preferable.

From the viewpoint of reducing haze and reducing agglomeration property, for example, the molecular weight $M_B$ of the organic compound B is typically $2 \times 10^4$ or less, preferably $1.8 \times 10^4$ or less, more preferably $1.5 \times 10^4$ or less, and still more preferably $1.2 \times 10^4$ or less. In a preferred embodiment, the molecular weight $M_B$ of the organic compound B may be $1 \times 10^4$ or less, and may be $9.5 \times 10^3$ or less (typically $9 \times 10^3$ or less), for example. For instance, when PEO-PPO-PEO-type triblock copolymer is used as the organic compound B, the molecular weight $M_B$ is preferably $2 \times 10^4$ or less, preferably less than $1 \times 10^4$. For instance, when polyoxyethylene alkyl ether is used as the organic compound B, the molecular weight $M_B$ is preferably $1 \times 10^3$ or less, preferably 500 or less. For instance, when polyvinyl alcohol (PVA) is used as the organic compound B, the molecular weight $M_B$ is preferably $2 \times 10^4$ or less, preferably $1.25 \times 10^4$ or less. The molecular weight $M_B$ of the organic compound B is typically $2 \times 10^2$ or more, preferably $2.5 \times 10^2$ or more from the view point of reducing haze, for example. As the molecular weight $M_B$ of the organic compound B, a weight average molecular weight determined by GPC (aqueous system, in terms of polyethylene glycol) or a molecular weight calculated from the chemical formula can be adopted.

Favorable examples of the polishing composition disclosed here include the amido group-containing polymer A having molecular weight $M_A$ of $10 \times 10^4 \leq M_A \leq 50 \times 10^4$ and the organic compound B having molecular weight $M_B$ of $0.3 \times 10^4 \leq M_B \leq 2 \times 10^4$, the amido group-containing polymer A having molecular weight $M_A$ of $10 \times 10^4 \leq M_A \leq 50 \times 10^4$ and the organic compound B having molecular weight $M_B$ of $300 \leq M_B \leq 0.3 \times 10^4$, and the amido group-containing polymer A having molecular weight $M_A$ of $5 \times 10^4 \leq M_A \leq 40 \times 10^4$ and the organic compound B having molecular weight $M_B$ of $0.8 \times 10^4 \leq M_B \leq 3 \times 10^4$. Such amido group-containing polymer A and organic compound B having molecular weight in these ranges can lead to both of the performances of reducing haze and of reducing agglomeration property at a higher level.

<Water>

The polishing composition disclosed here typically includes, in addition to the amido group-containing polymer A, water. As the water, ion-exchanged water (deionized water), pure water, ultrapure water, and distilled water can be preferably used, for example. In the water used, the total content of transition metal ions is preferably 100 ppb or less, for example, in order to avoid the inhibition of functions of other components contained in the polishing composition as much as possible. For example, the water purity can be increased by an ion exchange resin to remove impurity ions, by a filter to remove foreign substances, distillation, or similar operations.

The polishing composition disclosed here may further contain an organic solvent homogeneously miscible with water (such as lower alcohols and lower ketones), as needed. Commonly, 90% by volume or more of the solvent contained in the polishing composition is preferably water, and 95% by volume or more (typically, 99 to 100% by volume) of the solvent is more preferably water.

The polishing composition (typically, a slurry composition) disclosed here can be preferably provided, for example, in such a form that the non-volatile content (NV) is 0.01% by mass to 50% by mass and the remainder is an aqueous solvent (water or a mixed solvent of water and the above-mentioned organic solvent) or the remainder is an aqueous solvent and a volatile compound (such as ammonia). More preferred is a form in which the non-volatile content NV is 0.05% by mass to 40% by mass. The non-volatile content (NV) is the mass proportion of the residues after a polishing composition is dried at 105° C. for 24 hours, relative to the polishing composition.

<Abrasives>

The polishing composition disclosed here is used in the presence of abrasives. The abrasives have a function of mechanically polishing the surface of silicon wafers. In the polishing composition disclosed here, the abrasives also have a function of rubbing the amido group-containing polymer A that has adsorbed to the surface of the abrasives against a silicon wafer or a function of removing the amido group-containing polymer A that has adsorbed to a silicon wafer. This adjusts the chemical polishing by a silicon-wafer polishing removal accelerator. The wording "polishing composition being used in the presence of abrasives" in the description covers the form of the polishing composition containing abrasives. Such a form can be understood as a favorable embodiment for the polishing composition disclosed here. Therefore, the wording "polishing composition being used in the presence of abrasives" can be replaced with the wording "polishing composition containing abrasives". Alternatively abrasives may be used in the form of fixed abrasives encapsulated in a polishing pad, for example.

Materials of the abrasives disclosed here are not limited to particular materials and can be appropriately selected according to an intended purpose and a usage form of the polishing composition, for example. Examples of the abrasives include inorganic particles, organic particles, and organic-inorganic composite particles. Specific examples of the inorganic particles include oxide particles such as silica particles, alumina particles, cerium oxide particles, chromium oxide particles, titanium dioxide particles, zirconium oxide particles, magnesium oxide particles, manganese dioxide particles, zinc oxide particles, and colcothar particles; nitride particles such as silicon nitride particles and boron nitride particles; carbide particles such as silicon carbide particles and boron carbide particles; diamond particles; and carbonates such as calcium carbonate and barium carbonate. Specific examples of the organic particles include polymethyl methacrylate (PMMA) particles, poly(meth) acrylic acid particles (here, the (meth)acrylic acid inclusively means acrylic acid and methacrylic acid), and polyacrylonitrile particles. Such abrasive grain types may be used singly or in combination of two or more of them.

The abrasives are preferably inorganic particles, and specifically preferably particles of a metal oxide or a metalloid oxide. The abrasives usable in the technique disclosed here are preferably exemplified by silica particles. The reason for this is as follows: When silica particles composed of oxygen atoms and the same element as an object to be polished (silicon wafer) are used as the abrasives, residues of a different metal or a different metalloid from silicon are not generated after polishing, and this eliminates the possibility of contamination of the surface of a silicon wafer or of deterioration of electrical properties as a silicon wafer due to diffusion of a different metal or a different metalloid from silicon in an object to be polished. As a preferred embodiment of the polishing composition from such a viewpoint, a polishing composition containing silica particles alone as the abrasives is exemplified. In addition, the silica has such characteristics that highly pure silica is easily available. This is also exemplified as the reason why the silica particles are preferred as the abrasives. Specific examples of the silica particles include colloidal silica, fumed silica, and precipitated silica. From the viewpoint that scratches are unlikely to be generated on the surface of an object to be polished and a surface having a lower haze can be achieved, preferred examples of the silica particles include colloidal silica and fumed silica. Of them, colloidal silica is preferred. Specifically, colloidal silica can be preferably adopted as the abrasives in a polishing composition used for polishing (especially, final polishing) of silicon wafers.

The silica constituting the silica particles preferably has a true specific gravity of 1.5 or more, more preferably 1.6 or more, and even more preferably 1.7 or more. Silica having a larger true specific gravity enables an improvement of polishing rate (the removal amount of the surface of an object to be polished per unit time) at the time of polishing of a silicon wafer. From the viewpoint of reducing scratches generated on the surface (polished face) of an object to be polished, silica particles having a true specific gravity of 2.2 or less are preferred. As the true specific gravity of silica, a measured value determined by a liquid displacement method using ethanol as the displacement liquid can be adopted.

In the technique disclosed here, the abrasives included in the polishing composition may be in the form of primary particles or in the form of secondary particles formed by assembly of a plurality of primary particles. Abrasives in the form of primary particles may be mixed with abrasives in the form of secondary particles. In a preferred embodiment, at least some of the abrasives are contained in the form of secondary particles in the polishing composition.

The average primary particle size $D_{P1}$ of the abrasives is not limited to particular values, but is preferably 5 nm or more and more preferably 10 nm or more from the viewpoint of polishing efficiency, for example. From the viewpoint of achieving higher polishing effect, the average primary particle size $D_{P1}$ is preferably 15 nm or more and more preferably 20 nm or more (for example, more than 20 nm). From the viewpoint of easily giving a more smoothing surface, the average primary particle size $D_{P1}$ is typically 100 nm or less appropriately, preferably 50 nm or less and more preferably 40 nm or less. From the viewpoint of giving a higher-quality surface and the like, the average primary particle size $D_{P1}$ of the abrasives may be 35 nm or less (typically, less than 30 nm).

In the technique disclosed here, the average primary particle size $D_{P1}$ of abrasives can be, for example, calculated in accordance with the equation, average primary particle size $D_{P1}$ (nm)=2727/S where S is the specific surface area (m$^2$/g) determined by the BET method. The specific surface area of abrasives can be determined by using a surface area analyzer, trade name "Flow Sorb II 2300" manufactured by Micromeritics, for example.

The average secondary particle size $D_{P2}$ of the abrasives is preferably 10 nm or more and more preferably 20 nm or more from the viewpoint of polishing rate, for example. From the viewpoint of achieving higher polishing effect, the average secondary particle size $D_{P2}$ is preferably 30 nm or more, more preferably 35 nm or more, and even more preferably 40 nm or more (for example, more than 40 nm). From the viewpoint of giving a more smoothing surface, the average secondary particle size $D_{P2}$ of the abrasives is 200 nm or less appropriately, 150 nm or less preferably and 100 nm or less more preferably. From the viewpoint of giving a higher-quality surface, for example, the technique disclosed here can be embodied preferably when the abrasives are used having the average secondary particle size $D_{P2}$ less than 70 nm (preferably 60 nm or less, e.g., less than 50 nm) as well.

The average secondary particle size $D_{P2}$ of abrasives can be determined by the following procedure. An aqueous dispersion liquid of intended abrasives is used as a measurement sample, and is subjected to dynamic light scattering by using a particle size distribution analyzer, model "UPA-UT151" manufactured by NIKKISO CO., LTD., for example. The concentration of abrasives in an aqueous dispersion liquid as the measurement sample is not limited to particular values, but from the viewpoint of measurement accuracy, the concentration of abrasives is preferably 0.5% by mass or less and more preferably 0.2% by mass or less.

The average secondary particle size $D_{P2}$ of abrasives is commonly equal to or more than the average primary particle size $D_{P1}$ of the abrasives ($D_{P2}/D_{P1} \geq 1$) and is typically more than $D_{P1}$ ($D_{P2}/D_{P1} > 1$). Although not critical, from the viewpoint of polishing effect and surface smoothness after polishing, the $D_{P2}/D_{P1}$ of the abrasives is commonly, appropriately in a range of 1.2 to 3, preferably in a range of 1.5 to 2.5, and more preferably in a range of 1.7 to 2.3 (for example, exceeding 1.8 and not more than 2.2).

The shape (outer shape) of the abrasives may be spherical or nonspherical. Specific examples of the shape of nonspherical abrasives include a peanut-like shape (or a peanut shell-like shape), a cocoon-like shape, a konpeito- (pointed sugar candy ball-) like shape, and a rugby ball-like shape. For example, abrasives in which many of the abrasives have a peanut-like shape can be preferably adopted.

The average of major axis length/minor axis length ratios (average aspect ratio) of primary particles of the abrasives is not limited to particular values, but is preferably 1.05 or more and more preferably 1.1 or more. When the abrasives have a larger average aspect ratio, a higher polishing rate can be achieved. The abrasives preferably has an average aspect ratio of 3.0 or less, more preferably 2.0 or less, and even more preferably 1.5 or less from the viewpoint of reducing scratches, for example.

The shape (outer shape) and the average aspect ratio of the abrasives can be determined by observation under an electron microscope, for example. Specific procedures for determining the average aspect ratio are as follows: For example, a predetermined number (for example, 200 pieces) of abrasives that can be identified to have independent particle shapes are observed under a scanning electron microscope (SEM), and a rectangle is circumscribed around each grain image so as to have a minimum area. The long side length (major axis length) of the rectangle circumscribing each grain image is divided by the short side length (minor axis length), and the calculated value is regarded as the major axis length/minor axis length ratio (aspect ratio). The arithmetic mean of the aspect ratios of the predetermined number of grains can be calculated to give the average aspect ratio.

<Silicon-Wafer Polishing Removal Accelerator>

The polishing composition disclosed here typically includes, in addition to the amido group-containing polymer A, the organic compound B, and the water, a silicon-wafer polishing removal accelerator. The silicon-wafer polishing removal accelerator added to the polishing composition is a component that has a function of chemically polishing a surface to be polished and contributes to an improvement of polishing rate. The silicon-wafer polishing removal accelerator has a function of chemically etching silicon and is typically a basic compound. The basic compound contained in a polishing composition increases the pH of the polishing composition and improves the dispersion state of the abrasives or the amido group-containing polymer A. The basic compound thus can help the polishing composition to have higher dispersion stability and the abrasives to achieve higher mechanical polishing performance.

As the basic compound, nitrogen-containing organic or inorganic basic compounds, hydroxides of alkali metals or alkaline earth metals, and various carbonates and hydrogen carbonates can be used. Examples of the basic compound include hydroxides of alkali metals, hydroxides of quaternary ammoniums or salts thereof, ammonia, and amines. Specific examples of the hydroxides of alkali metals include potassium hydroxide and sodium hydroxide. Specific examples of the carbonates and the hydrogen carbonates include ammonium hydrogen carbonate, ammonium carbonate, potassium hydrogen carbonate, potassium carbonate, sodium hydrogen carbonate, and sodium carbonate. Specific examples of the hydroxides of quaternary ammoniums or salts thereof include tetramethylammonium hydroxide, tetraethylammonium hydroxide, and tetrabutylammonium hydroxide. Specific examples of the amine include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methylpiperazine, guanidine, and azoles such as imidazole and triazole. These basic compounds can be used singly or in combination of two or more of them.

Preferred examples of the basic compound from the viewpoint of improvement of polishing rate and the like include ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, and sodium carbonate. Specifically preferred examples include ammonia, potassium hydroxide, sodium hydroxide, tetramethylammonium hydroxide, and tetraethylammonium hydroxide. More preferred examples include ammonia and tetramethylammonium hydroxide. As a particularly preferred basic compound, ammonia is exemplified.

<Other Components>

The polishing composition disclosed here can further contain known additives usable in polishing compositions (typically, polishing compositions used for final polishing of silicon wafers), such as a chelating agent, an organic acid, an organic acid salt, an inorganic acid, an inorganic acid salt, an antiseptic agent, and a fungicide, as needed, to such an extent as not to markedly suppress effects of the invention.

Examples of the chelating agent include aminocarboxylic acid chelating agents and organic phosphonic acid chelating agents. Examples of the aminocarboxylic acid chelating agent include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetraminehexaacetic acid, and sodium triethylenetetraminehexaacetate. Examples of the organic phosphonic acid chelating agent include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Of them, organic phosphonic acid chelating agents are more preferred, and ethylenediaminetetrakis(methylenephosphonic acid) and diethylenetriaminepenta(methylenephosphonic acid) are even more preferred. As a particularly preferred chelating agent, ethylenediaminetetrakis(methylenephosphonic acid) is exemplified.

Examples of the organic acid include fatty acids such as formic acid, acetic acid, and propionic acid and aromatic carboxylic acids such as benzoic acid and phthalic acid, citric acid, oxalic acid, tartaric acid, malic acid, maleic acid, fumaric acid, succinic acid, organic sulfonic acids, and organic phosphonic acids. Examples of the organic acid salt include alkali metal salts (including sodium salts and potassium salts) of organic acids and ammonium salts of organic acids. Examples of the inorganic acid include sulfuric acid, nitric acid, hydrochloric acid, and carbonic acid. Examples of the inorganic acid salt include alkali metal salts (including sodium salts and potassium salts) of inorganic acids and ammonium salts of inorganic acids. The organic acids and salts thereof and the inorganic acids and salts thereof can be used singly or in combination of two or more of them.

Examples of the antiseptic agent and the fungicide include isothiazoline compounds, p-hydroxybenzoate esters, and phenoxyethanol.

<Application>

The polishing composition disclosed here can be used for polishing objects to be polished composed of single crystalline silicon (silicon wafers). The object to be polished may have any shape. The polishing composition disclosed here can be preferably applied for polishing an object to be polished having, for example, a plate-like shape or a polyhedron shape with a flat surface or for polishing an edge of an object to be polished (for example, polishing a wafer edge).

The polishing composition disclosed here can be preferably used for final polishing of an object to be polished. Hence, the description provides a method for producing polished objects, including a final polishing step using the polishing composition (for example, a method for producing silicon wafers). The final polishing means the last polishing step in a production process of target products (in other words, the step after which no further polishing is performed). The polishing composition disclosed here can be used in a polishing step at the upstream side of the final polishing (a preliminary polishing step between a rough polishing step and the final polishing step; typically including at least a primary polishing step, and capable of including further polishing steps such as a secondary polishing step and a tertiary polishing step) and, for example, in a polishing step immediately before the final polishing.

The polishing composition disclosed here is particularly preferably applied to polishing of a silicon wafer. For example, the polishing composition is preferably applied as a polishing composition used in the final polishing of a silicon wafer and in a polishing step at the upstream side of the final polishing. For instance, the polishing composition is effectively applied to polishing of a silicon wafer prepared by a polishing step at the upstream side of the final polishing to have a surface condition with a surface roughness of 0.01 nm to 100 nm (typically to the final polishing or polishing immediately before the final polishing), for example. The polishing composition is particularly preferably applied to the final polishing.

<Polishing Liquid>

The polishing composition disclosed here is supplied to an object to be polished typically in the form of a polishing liquid containing the polishing composition, and is used for polishing the object to be polished. The polishing liquid can be prepared by diluting any of the polishing compositions disclosed here (typically diluted with water), for example. Alternatively, the polishing composition may be used without any treatment as the polishing liquid. In other words, the concept of the polishing composition in the technique disclosed here encompasses both a polishing liquid that is supplied to an object to be polished and is used for polishing the object to be polished (working slurry) and a concentrated liquid that is diluted and used as a polishing liquid (a stock solution of a polishing liquid). Other examples of the polishing liquid containing the polishing composition disclosed here include a polishing liquid prepared by adjusting the pH of the polishing composition.

The content of the amido group-containing polymer A in the polishing liquid is not limited to particular values and can be $1 \times 10^{-4}$% by mass or more, for example. From the viewpoint of reducing haze and the like, the content is preferably $5 \times 10^{-4}$% by mass or more, more preferably $1 \times 10^{3}$% by mass or more, and, for example, $2 \times 10^{-3}$% by mass or more. From the viewpoint of polishing rate and the like, this content is preferably 0.2% by mass or less and more preferably 0.1% by mass or less (for example, 0.05% by mass or less). When the polishing liquid contains two or more types of amido group-containing polymers A, the content refers to the total content of all of the amido group-containing polymers A contained in the polishing liquid.

The content of the organic compound B in the polishing liquid is not limited to particular values and can be $1 \times 10^{-5}$% by mass or more, for example. From the viewpoint of reducing haze and reducing agglomeration property, for example, the content is preferably $3 \times 10^{-5}$% by mass or more, more preferably $5 \times 10^{-5}$% by mass or more, and, for example, $8 \times 10^{-5}$% by mass or more. The content is preferably 0.2% by mass or less and more preferably 0.1% by mass or less (for example, 0.05% by mass or less). When the polishing liquid contains two or more types of organic compounds B, the content refers to the total content of all of the organic compounds B contained in the polishing liquid.

The mass ratio (w1/w2) of the content w1 of the amido group-containing polymer A and the content w2 of the organic compound B is not limited to particular values and can be in the range of 0.01 to 1000, for example, preferably in the range of 0.05 to 500, more preferably in the range of 0.1 to 200, and still more preferably in the range of 0.5 to 150.

When the polishing composition disclosed here contains abrasives, the content of the abrasives in the polishing liquid is not limited to particular values, but is typically 0.01% by mass or more, preferably 0.05% by mass or more, more preferably 0.1% by mass or more, and, for example, 0.15% by mass or more. When the content of the abrasives is increased, a higher polishing rate can be achieved. From the viewpoint of achieving a surface with a lower haze, the content of the abrasives in the polishing liquid is commonly, appropriately 10% by mass or less, preferably 7% by mass or less, more preferably 5% by mass or less, even more preferably 2% by mass or less, and, for example, 1% by mass or less.

The content of the silicon-wafer polishing removal accelerator in the polishing liquid disclosed here is not limited to particular values. From the viewpoint of an improvement of polishing rate and the like, the content is commonly, preferably 0.001% by mass or more of the polishing liquid and is more preferably 0.003% by mass or more. From the viewpoint of reducing haze and the like, the content of the silicon-wafer polishing removal accelerator in the polishing liquid is preferably less than 0.4% by mass and more preferably less than 0.25% by mass.

The lower limit of the pH of the polishing liquid is not limited to particular values. For example, the pH is preferably 8.0 or more, more preferably 9.0 or more, and most preferably 9.5 or more. When the polishing liquid has a pH of 8.0 or more (more preferably 9.0 or more, most preferably 9.5 or more), the polishing rate of a silicon wafer is improved, and a silicon wafer with high surface accuracy can be efficiently produced. In addition, the dispersion stability of particles in the polishing liquid is improved. The upper limit of the pH of the polishing liquid is not limited to particular values, but is preferably 12.0 or less and more preferably 11.0 or less. When the polishing liquid has a pH of 12.0 or less (more preferably 11.0 or less), the abrasives (especially, silica particles such as colloidal silica, fumed silica, and precipitated silica) contained in the polishing liquid are prevented from dissolving due to a basic compound, and a reduction of the mechanical polishing performance of the abrasives can be suppressed. The pH can be adjusted by the above-mentioned basic compound or an organic acid or an inorganic acid of the above-mentioned other components. The pH value can be preferably applied to a polishing liquid used for polishing silicon wafers (for example, a polishing liquid for final polishing). The pH of a polishing liquid is determined as follows: A pH meter (for example, a glass electrode-type hydrogen ion concentration indicator (model: F-23) manufactured by Horiba, Ltd.) and standard buffer solutions (a phthalate pH buffer solution with a pH of 4.01 (25° C.), a neutral phosphate pH buffer solution with a pH of 6.86 (25° C.), and a carbonate pH buffer solution with a pH of 10.01 (25° C.)) were used to perform three-point calibration. The glass electrode is then immersed in a polishing liquid, and after 2 minutes or longer, a stabilized value is recorded.

<Concentrated Liquid>

The polishing composition disclosed here may be in a concentrated form (that is, the form of a concentrated liquid of the polishing liquid) before supplied to an object to be polished. The polishing composition in such a concentrated liquid form has advantages from the viewpoint of the convenience at the time of production, distribution, storage, and the like and cost reduction, for example. The concentration rate can be, for example, about 2 to 100 and is commonly, appropriately about 5 to 50 in terms of volume. The concentration rate of a polishing composition pertaining to a preferred embodiment is 10 to 40 and, for example, 15 to 25.

The polishing composition in such a concentrated liquid form can be used in such a way that the polishing composition is diluted at an appropriate timing to give a polishing liquid, and the polishing liquid is supplied to an object to be polished. The dilution can be typically performed by adding the above-mentioned aqueous solvent to the concentrated liquid and mixing the whole. When the aqueous solvent is a mixed solvent, some of the components in the aqueous solvent may be added for dilution, or a mixed solvent containing these components at a ratio different from that of the aqueous solvent may be added for dilution. For a multi-pack type polishing composition as described later, some of the packed components may be diluted, and then the other packed components may be mixed to prepare a polishing liquid. Alternatively, a plurality of packed components may be mixed, and then the mixture may be diluted to prepare a polishing liquid.

The NV of the concentrated liquid can be 50% by mass or less, for example. From the viewpoint of stability of the polishing composition (for example, dispersion stability of abrasives), filterability, and the like, the NV of the concentrated liquid is commonly, appropriately 40% by mass or less, preferably 30% by mass or less, more preferably 20% by mass or less, and, for example, 15% by mass or less. From the viewpoint of the convenience at the time of production, distribution, storage, and the like, cost reduction, and the like, the NV of the concentrated liquid is appropriately 0.5% by mass or more, preferably 1% by mass or more, more preferably 3% by mass or more, and, for example, 5% by mass or more.

The content of the amido group-containing polymer A in the concentrated liquid can be 3% by mass or less, for example. From the viewpoint of filterability of the polishing composition, cleanability, and the like, the content of the amido group-containing polymer A in the concentrated liquid is commonly, preferably 1% by mass or less and more preferably 0.5% by mass or less. From the viewpoint of the convenience at the time of production, distribution, storage, and the like, cost reduction, and the like, the content of the amido group-containing polymer A in the concentrated liquid is commonly, appropriately $1\times10^{-3}$% by mass or more, preferably $5\times10^{3}$% by mass or more, and more preferably $1\times10^{-2}$% by mass or more.

The content of the organic compound B in the concentrated liquid can be 2% by mass or less, for example. From the viewpoint of filterability of the polishing composition and the like, the content of the organic compound B in the concentrated liquid is commonly, preferably 1% by mass or less and more preferably 0.5% by mass or less. From the viewpoint of the convenience at the time of production, distribution, storage, and the like, cost reduction, and the like, the content of the organic compound B in the concentrated liquid is commonly, appropriately $1\times10^{-5}$% by mass or more.

When the polishing composition disclosed here contains abrasives, the content of the abrasives in the concentrated liquid can be 50% by mass or less, for example. From the viewpoint of stability of the polishing composition (for example, dispersion stability of abrasives), filterability, and the like, the content of the abrasives in the concentrated liquid is commonly, preferably 45% by mass or less and more preferably 40% by mass or less. In a preferred embodiment, the content of the abrasives in the concentrated liquid may be 30% by mass or less and may be 20% by mass or less (for example, 15% by mass or less). From the viewpoint of the convenience at the time of production, distribution, storage, and the like, cost reduction, and the like, the content of the abrasives in the concentrated liquid can be, for example, 0.5% by mass or more and is preferably 1% by mass or more and more preferably 3% by mass or more (for example, 5% by mass or more).

The polishing composition disclosed here may be a one-pack type or a multi-pack type including a two-pack type. For example, the polishing composition can be composed in such a manner that liquid I containing some of the components of the polishing composition (for example, a dispersion liquid containing abrasives (such as silica particles), a silicon-wafer polishing removal accelerator, and water) is mixed with liquid II containing the remaining components (for example, a liquid containing an amido group-containing polymer A and an organic compound B), and the mixture is used for polishing an object to be polished. Alternatively abrasives prepared separately may be mixed at a predetermined timing with the polishing composition containing a silicon-wafer polishing removal accelerator, an amido group-containing polymer A, an organic compound B, and water.

<Preparation of Polishing Composition>

The production method of the polishing composition disclosed here is not limited to particular methods. For example, a well-known mixer such as a blade-type stirrer, an ultrasonic disperser, and a homomixer is used to mix components contained in the polishing composition. The manner of mixing these components is not limited to particular manners. For example, all the components may be concurrently mixed, or the components may be mixed in an appropriate order.

<Polishing>

The polishing composition disclosed here can be used for polishing an object to be polished in such a manner as to include the following operations, for example. A preferred embodiment of the method for polishing an object to be polished by using the polishing composition disclosed here will next be described.

That is, a polishing liquid (typically, a polishing liquid in a slurry form, also called a polishing slurry) containing any of the polishing compositions disclosed here is prepared. The preparing a polishing liquid can include preparing a polishing liquid by subjecting a polishing composition to concentration adjustment (for example, dilution), pH adjustment, or other operations. Alternatively, the polishing composition may be used as the polishing liquid without any treatment. For a multi-pack type polishing composition, the preparing a polishing liquid can include mixing packed components, diluting one or a plurality of packed components before the mixing, and diluting the mixture after the mixing, for example.

Next, the polishing liquid is supplied to an object to be polished, and the object is polished in usual ways. For example, when a silicon wafer is subjected to final polishing, a silicon wafer that has been subjected to a lapping step and a preliminary polishing step is set to a common polishing apparatus, and the polishing liquid is supplied to a surface (face to be polished) of the silicon wafer through a polishing pad on the polishing apparatus. Typically, while the polishing liquid is continuously supplied, the polishing pad is pressed against the surface of the silicon wafer, and the polishing pad and the silicon wafer are relatively moved (for example, rotationally moved). Through the polishing step, the polishing of the object to be polished is completed.

The polishing pad used in the polishing step may be any polishing pad. For example, any of nonwoven fabric polishing pads, suede polishing pads, polishing pads containing abrasives and not containing abrasives can be used.

<Rinsing>

The object polished by using the polishing composition disclosed here that contain abrasives can be rinsed with a rinse solution that contains the same components as in the polishing composition but contains no abrasives. In other words, the method of polishing an object to be polished may include a step of rinsing the object to be polished by using a rinse solution that contains the same components as in the polishing composition but contains no abrasives (rinsing step). The rinsing step enables a reduction of residues such as abrasives that can cause surface defects or haze of an object to be polished. The rinsing step may be performed between a polishing step and another polishing step or may be performed after the final polishing step and before the cleaning step described later. Rinsing with the rinse solution that contains the same components as in the polishing composition but contains no abrasives enables a further reduction of defects or haze without impairing the function of the amido group-containing polymer A that has adsorbed onto the surface of a silicon wafer. Such a rinse solution can typically be a composition for polishing silicon wafers containing a silicon-wafer polishing removal accelerator, an amido group-containing polymer A, and water (specifically a composition used for rinsing a polished silicon wafer; also called a rinsing composition). The formulation and the like of the silicon wafer rinsing composition are basically the same as those of the above-mentioned composition for polishing silicon wafers except that no abrasives are contained, and the explanation is not repeated.

<Cleaning>

An object polished by using the polishing composition disclosed here is typically cleaned after polishing (after rinsing as needed). The cleaning can be performed by using an appropriate cleaning solution. The cleaning solution used may be any cleaning solution. For example, an SC-1 cleaning solution (a mixed solution of ammonium hydroxide ($NH_4OH$), hydrogen peroxide ($H_2O_2$), and water ($H_2O$); hereinafter, cleaning with the SC-1 cleaning solution is called "SC-1 cleaning") or an SC-2 cleaning solution (a mixed solution of HCl, $H_2O_2$, and $H_2O$), which are commonly used in the field of semiconductors and the like, can be used. The temperature of the cleaning solution is room temperature to about 90° C., for example. From the viewpoint of improving cleaning efficiency, a cleaning solution at about 50° C. to 85° C. can be preferably used.

Some examples relating to the present invention will next be described, but the present invention is not intended to be limited to these examples. In the following description, "part" and "%" are in terms of mass unless otherwise specified.

<Preparation of Polishing Composition>

EXAMPLE 1

Abrasives, a water-soluble polymer, an organic compound, ammonia water (concentration 29%) and deionized water were mixed to give a concentrated liquid of a polishing composition. The concentrated liquid was diluted with deionized water 20 times to give a polishing composition of Example 1.

As the abrasives, colloidal silica having an average primary particle size of 35 nm was used. The average primary particle size was determined by using a surface area analyzer, trade name "Flow Sorb II 2300" manufactured by Micromeritics.

As the water-soluble polymer, polyacryloylmorpholine (hereinafter called "PACMO") having an Mw of $33 \times 10^4$ was used.

As the organic compound, a PEO-PPO-PEO-type triblock copolymer (PPO at the center part and PEO at both ends, hereinafter called "PEO-PPO-PEO") having an Mw of $9 \times 10^3$ was used. The molar proportion of the EO unit and the PO unit in the PEO-PPO-PEO was EO:PO=85:15.

The amount of the abrasives, the water-soluble polymer, the organic compound, and the ammonia water was set so that the content of the abrasives in the polishing composition was 0.46%, the content of the water-soluble polymer therein was 0.010%, the content of the organic compound therein was 0.0025% and the content of the ammonia water ($NH_3$) was 0.010%.

EXAMPLE 2

A polishing composition of this example was prepared in the same manner as in Example 1 except that as the organic compound, polyoxyethylene (the addition number of moles of ethylene oxide was 5) decyl ether (hereinafter called "C10PEO5") having an Mw of 378 was used, and the content of C10PEO5 in the composition was 0.0003%.

EXAMPLE 3

A polishing composition of this example was prepared in the same manner as in Example 1 except that as the water-soluble polymer, PACMO having an Mw of $17 \times 10^4$ was used, as the organic compound, polyvinyl alcohol (having a saponification degree of 95% by mole or more, hereinafter called "PVA") having an Mw of $1.2 \times 10^4$ was used, and the content of the PVA in the polishing composition was 0.0100%.

EXAMPLE 4

A polishing composition of this example was prepared in the same manner as in Example 1 except that as the organic compound, the same PVA as in Example 3 and the same PEO-PPO-PEO as in Example 1 were used, the content of the PVA in the polishing composition was 0.005%, and the content of the PEO-PPO-PEO was 0.0025%.

EXAMPLE 5

A polishing composition of this example was prepared in the same manner as in Example 1 except that the content of the abrasives in the polishing composition was 0.35%.

COMPARATIVE EXAMPLE 1

A polishing composition of this example was prepared in the same manner as in Example 1 except that as the water-soluble polymer, PACMO having an Mw of $17 \times 10^4$ was used, and PEO-PPO-PEO was not used.

COMPARATIVE EXAMPLE 2

A polishing composition of this example was prepared in the same manner as in Example 1 except that PEO-PPO-PEO was not used.

COMPARATIVE EXAMPLE 3

A polishing composition of this example was prepared in the same manner as in Example 1 except that hydroxyethyl cellulose (hereinafter called "HEC") having an Mw of $25 \times 10^4$ was used in place of PACMO and the content of the HEC in the polishing composition was 0.017%.

COMPARATIVE EXAMPLE 4

A random copolymer of EO and PO (having an Mw of $10 \times 10^4$, hereinafter called "EOPO random copolymer") was used in place of PEO-PPO-PEO, and the content of the EOPO random copolymer in the polishing composition was 0.017%. The molar proportion of EO unit and PO unit in the EOPO random copolymer was EO:PO=12:1. As the water-soluble polymer, PACMO having an Mw of $7 \times 10^4$ was used, and the content of the PACMO in the polishing composition was 0.005%. A polishing composition of this example was prepared in the same manner as in Example 1 in other respects.

<Polishing of Silicon Wafer>

The polishing composition of each example was used without any treatment as a polishing liquid to polish the surface of a silicon wafer under the following conditions. The silicon wafer used was prepared as follows: A p-type silicon wafer having a diameter of 300 mm, a crystal orientation of <100>, and a resistivity of not less than 0.1 Ω·cm and less than 100 Ω·cm, prepared by rough polishing was subjected to preliminary polishing by using a polishing slurry (manufactured by Fujimi, Inc., trade name "GLAN-ZOX 2100") to adjust the surface roughness to 0.1 nm to 10 nm.

<Polishing Conditions>

Polishing apparatus: a single wafer polishing machine, model "PNX-332B" manufactured by Okamoto Machine Tool Works, Ltd.

Polishing table: the latter two tables of three tables of the polishing apparatus were used to perform the first and second steps of final polishing after the preliminary polishing.

(the following conditions were applied to each table)
Polishing load: 15 kPa
Rotation rate of surface plate: 30 rpm
Rotation rate of head: 30 rpm
Polishing time: 2 minutes
Temperature of polishing liquid: 20° C.
Supply rate of polishing liquid: 2.0 liter/min (free-flowing)

<Cleaning>

A cleaning solution prepared having the composition of ammonia water (concentration 29%), aqueous hydrogen peroxide (concentration 31%), and deionized water (DIW) =1:3:30 (volume ratio) was used to clean the silicon wafer after polishing (SC-1 cleaning). More specifically, two cleaning chambers each equipped with an ultrasonic oscillator at a frequency of 950 kHz were prepared, and the cleaning solution was placed in each of the first and second cleaning chambers and kept at 60° C. Next, a silicon wafer after polishing was immersed in the cleaning solution in the first cleaning chamber for 6 minutes while the ultrasonic oscillator was activated, then was immersed and rinsed in ultrapure water in a rinse chamber while an ultrasonic oscillator was activated, and was further immersed in the cleaning solution in the second cleaning chamber for 6 minutes while the ultrasonic oscillator was activated.

<Measurement of Haze>

The haze (in terms of ppm) of the surface of a silicon wafer after cleaning was measured by using a wafer inspection apparatus, trade name "Surfscan SP2" manufactured by KLA-Tencor in a DWO mode. The obtained results were converted into relative values where the haze value of Comparative Example 1 was 100%, and are illustrated in Table 1.

<Evaluation of Agglomeration Property>

In order to evaluate the agglomeration property of a polishing composition, the agglomerating rate of the polishing composition was measured. The agglomerating rate of a polishing composition in the description is defined as the ratio of $R_1$ to $R_2$ (i.e., $R_1/R_2$) where $R_1$ denotes the average particle size of the particles in the polishing composition and $R_2$ denotes the average particle size of the abrasives in a comparison composition described later. A smaller agglomerating rate means lower agglomeration property of the polishing composition. The following specifically describes a method of measuring the agglomerating rate of a polishing composition.

The polishing composition was used as a measurement sample and the average particle size (volume average particle size) $R_1$ of the particles in the polishing composition was measured by an analyzer, model "UPA-UT151" manufactured by NIKKISO CO., LTD on the basis of dynamic light scattering (the same apparatus was used for the measurement of $R_2$). Next, a comparison composition was prepared by weighing the abrasives, the ammonia water and the deionized water used to produce the polishing compositions as stated above so that their contents agreed with those in the polishing compositions and mixing. Specifically the comparison composition was prepared in the same manner as in the method for manufacturing the polishing composition except that the water-soluble polymer and the organic compound were not used. The comparison composition obtained was used as a measurement sample and the average particle size (volume average particle size) $R_2$ of the particles in the comparison composition was measured on the basis of dynamic light scattering. As a result, all of the abrasives in the comparison compositions of Examples 1 to 4 and Comparative Examples 1 to 4 had the average particle size $R_2$ of 57 nm, and the abrasives in the comparison compositions of Example 5 had the average particle size $R_2$ of 42 nm. $R_1/R_2$ was calculated from the obtained values of $R_1$ and $R_2$, so as to determine the agglomerating rates of the polishing compositions. Table 1 illustrates $R_1$ of the polishing compositions of these examples and their agglomerating rates.

TABLE 1

| | Water-soluble polymer | | | Organic compound | | | Average | | |
| | Types | Molecular weight ($\times 10^4$) | Content (wt %) | Types | Molecular weight | Content (wt %) | Haze (%) | particle size $R_1$ (nm) | Agglomerating rate |
|---|---|---|---|---|---|---|---|---|---|
| Ex. 1 | PACMO | 33 | 0.010 | PEO-PPO-PEO | 9000 | 0.0025 | 70 | 58 | 1.02 |
| Ex. 2 | PACMO | 33 | 0.010 | C10PEO5 | 378 | 0.0003 | 70 | 61 | 1.07 |
| Ex. 3 | PACMO | 17 | 0.010 | PVA | 12000 | 0.0100 | 90 | 57 | 1.00 |
| Ex. 4 | PACMO | 33 | 0.010 | PVA | 12000 | 0.0050 | 70 | 58 | 1.02 |
| | | | | PEO-PPO-PEO | 9000 | 0.0025 | | | |
| Ex. 5 | PACMO | 33 | 0.010 | PEO-PPO-PEO | 9000 | 0.0025 | 60 | 44 | 1.05 |
| Comp. Ex. 1 | PACMO | 17 | 0.010 | — | — | — | 100 | 57 | 1.00 |
| Comp. Ex. 2 | PACMO | 33 | 0.010 | — | — | — | 105 | 62 | 1.09 |
| Comp. Ex. 3 | HEC | 25 | 0.017 | PEO-PPO-PEO | 9000 | 0.0025 | 70 | 72 | 1.26 |

TABLE 1-continued

| | Water-soluble polymer | | | Organic compound | | | Average | |
| --- | --- | --- | --- | --- | --- | --- | --- | --- |
| | Types | Molecular weight (×10⁴) | Content (wt %) | Types | Molecular weight | Content (wt %) | Haze (%) | particle size $R_1$ (nm) | Agglomerating rate |
| Comp. Ex. 4 | PACMO | 7 | 0.005 | EOPO random copolymer | 100000 | 0.0170 | 800 | 67 | 1.18 |

As illustrated in Table 1, the polishing compositions of Examples 1 to 5 containing the combination of PACMO having high molecular weight and organic compounds having low molecular weight had both of the performance of reducing haze and reducing agglomeration property at a high level. Among them, Examples 1, 2, 4 and 5 containing the organic compounds having an Mw less than 1×10⁴ had a more excellent effect of reducing haze. The polishing compositions of Examples 1, 4 and 5 containing PACMO having an Mw of 33×10⁴ and PEO-PPO-PEO having an Mw of 9000 had both of more excellent performance of reducing haze and reducing agglomeration property. On the contrary, both of the polishing compositions of Comparative Examples 1 and 2 containing PACMO singly were not enough in the performance of reducing haze. The polishing composition of Comparative Example 3 containing the combination of HEC having high molecular weight and PEO-PPO-PEO (organic compound) having low molecular weight led to a reduction in haze as compared with Comparative Examples 1 and 2, but had high agglomeration property, and so was not enough in balance between these performances. The polishing composition of Comparative Example 4 containing the combination of PACMO having low molecular weight and EOPO random copolymer (organic compound) having high molecular weight was poor in both of the performances of reducing haze and reducing agglomeration property. These results indicate that the combination of an amido group-containing polymer having high molecular weight and an organic compound having low molecular weight can achieve a good balance in the performances of reducing haze and reducing agglomeration property.

Specific examples of the present invention have been described in detail hereinbefore, but are merely illustrative examples, and are not intended to limit the scope of claims. The techniques described in the scope of claims include various modifications and changes of the above exemplified specific examples.

The invention claimed is:

1. A composition for polishing silicon wafers used in the presence of abrasives, comprising:
   a silicon-wafer polishing removal accelerator;
   an amido group-containing polymer A;
   an organic compound B not containing an amido group; and
   water,
   wherein the abrasives are colloidal silica, and
   wherein the amido group-containing polymer A having, on a main chain, a building block S derived from a monomer represented by General Formula (1),

[Chemical Formula 1]

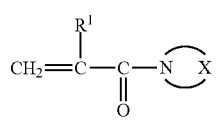

(1)

in the General Formula (1), $R^1$ is a hydrogen atom; an alkyl group, an alkenyl group, an alkynyl group, an aralkyl group, an alkoxy group, an alkoxyalkyl group, or an alkylol group having the number of carbon atoms of 1 to 6; an acetyl group; a phenyl group; a benzyl group; a chloro group; a difluoromethyl group; a trifluoromethyl group; or a cyano group, X is $(CH_2)_n$, where n is an integer of 4 to 6, $(CH_2)_2O(CH_2)_2$ or $(CH_2)_2S(CH_2)_2$, the organic compound B being a nonionic compound and selected from oxyalkylene polymer, polyoxyalkylene adduct, and copolymers of plurality types of oxyalkylenes, the amido group-containing polymer A having molecular weight $M_A$ and the organic compound B having molecular weight MB, the molecular weight $M_A$ and the molecular weight MB having a relation satisfying $200 \leq M_B < M_A$.

2. The composition for polishing silicon wafers according to claim 1, wherein a ratio (MA/MB) of the molecular weight MA of the amido group-containing polymer A to the molecular weight MB of the organic compound B is more than 5.

3. The composition for polishing silicon wafers according to claim 1, wherein the molecular weight MB of the organic compound B is less than 1×10⁴.

4. The composition for polishing silicon wafers according to claim 1, wherein the molecular weight MA of the amido group-containing polymer A is less than 50×10⁴.

5. The composition for polishing silicon wafers according to claim 1, wherein in the General Formula (1), $R^1$ is a hydrogen atom or a methyl group.

6. The composition for polishing silicon wafers according to claim 1, wherein in the General Formula (1), X is $(CH_2)_2O(CH_2)_2$.

7. The composition for polishing silicon wafers according to claim 1, wherein the proportion of the mole number of the building block S relative to the mole number of all building blocks contained in the molecular structure of the polymer is 97% by mole or more.

8. The composition for polishing silicon wafers according to claim 1, wherein the pH of the composition is 9.5 or more and 12.0 or less.

9. The composition for polishing silicon wafers according to claim 1, wherein the molecular weight MB of the organic compound B is 1.8×10⁴ or less.

10. The composition for polishing silicon wafers according to claim 1, wherein the content of the amido group-containing polymer A in the polishing composition is greater than zero to 0.1% by mass.

* * * * *